(12) United States Patent
Gröne et al.

(10) Patent No.: US 9,334,677 B2
(45) Date of Patent: May 10, 2016

(54) PRINTED CIRCUIT BOARD FOR USE IN MORTISE LOCKS

(75) Inventors: Kai Gröne, Witten (DE); Michael Suberg, Remschied (DE); Marc-André Schneider, Ennepetal (DE)

(73) Assignee: Dorma Deutschland GmbH, Ennepetal (DE)

( * ) Notice: Subject to any disclaimer, the term of this patent is extended or adjusted under 35 U.S.C. 154(b) by 191 days.

(21) Appl. No.: 14/233,542

(22) PCT Filed: May 30, 2012

(86) PCT No.: PCT/EP2012/002271
§ 371 (c)(1),
(2), (4) Date: Jan. 17, 2014

(87) PCT Pub. No.: WO2013/010607
PCT Pub. Date: Jan. 24, 2013

(65) Prior Publication Data
US 2014/0160711 A1    Jun. 12, 2014

(30) Foreign Application Priority Data
Jul. 19, 2011  (DE) .......................... 10 2011 051 948

(51) Int. Cl.
| | |
|---|---|
| *H05K 1/11* | (2006.01) |
| *H05K 1/14* | (2006.01) |
| *E05B 49/00* | (2006.01) |
| *E05B 17/22* | (2006.01) |
| *E05B 9/02* | (2006.01) |

(Continued)

(52) U.S. Cl.
CPC ................ *E05B 49/002* (2013.01); *E05B 9/02* (2013.01); *E05B 17/22* (2013.01); *H05K 1/0286* (2013.01); *H05K 1/117* (2013.01); *H05K 1/14* (2013.01); *H05K 1/142* (2013.01); *H05K 1/145* (2013.01); *H05K 3/368* (2013.01); *H05K 5/0043* (2013.01); *E05B 63/0056* (2013.01); *H05K 1/141* (2013.01); *H05K 2201/09127* (2013.01); *H05K 2201/10189* (2013.01)

(58) Field of Classification Search
CPC ......... H05K 1/14; H05K 1/141; H05K 1/142; H05K 1/144; H05K 1/145
USPC ......... 361/748, 784, 785, 786, 787, 789, 790, 361/791, 792, 801, 802, 803; 70/57
See application file for complete search history.

(56) References Cited

U.S. PATENT DOCUMENTS

| | | | | |
|---|---|---|---|---|
| 2007/0072444 A1* | 3/2007 | Okuyama | .............. | H05K 1/141 439/65 |
| 2011/0203331 A1* | 8/2011 | Picard | ....................... | E05B 9/02 70/91 |

FOREIGN PATENT DOCUMENTS

| | | | |
|---|---|---|---|
| DE | 200 22 102 U1 | | 3/2001 |
| WO | WO 03/033845 A1 | | 4/2003 |

*Primary Examiner* — Hoa C Nguyen
*Assistant Examiner* — Binh Tran
(74) *Attorney, Agent, or Firm* — Cozen O'Connor

(57) ABSTRACT

A mortise lock includes: a first printed circuit board; a contact pad arranged on the first printed circuit board; a second printed circuit board; a printed circuit board connector arranged on the second printed circuit board, the printed circuit board connector being configured to connect the first printed circuit board to the second printed circuit board; and a plug contact arranged on the second printed circuit board. The plug contact is configured to be accessible from outside of the mortise lock.

15 Claims, 10 Drawing Sheets

(51) Int. Cl.
  *H05K 1/02* (2006.01)
  *H05K 3/36* (2006.01)
  *H05K 5/00* (2006.01)
  *H05K 1/00* (2006.01)
  *H05K 1/18* (2006.01)
  *H05K 7/00* (2006.01)
  *E05B 63/00* (2006.01)

Detail Y

Detail Z

PRINTED CIRCUIT BOARD FOR USE IN MORTISE LOCKS

CROSS-REFERENCE TO RELATED APPLICATIONS

This is a U.S. national stage of application No. PCT/EP2012/002271, filed on 30 May 2012, which claims priority to the German Application No. 10 2011 051 948.3, filed 19 Jul. 2011, the content of both incorporated herein by reference.

BACKGROUND OF THE INVENTION

1. Field of the Invention

The present invention is directed to a printed circuit board adapted for mortise locks. The printed circuit board is used in combination with electronic components thereof for status requests and/or motor-actuated control of individual components of the lock mechanism. Further, the printed circuit board is configured such that it can be used for controlling a mechatronic switching unit. The mortise locks have different backsets with respect to one another.

2. Related Art

Specific printed circuit boards for different backsets for every mortise lock are disclosed in the prior art. They have the disadvantage that a large number of printed circuit board variants must be stocked in order to be able to outfit the respective mortise locks having the different backsets.

SUMMARY OF THE INVENTION

Therefore, it is an object of the present invention to provide a simply constructed printed circuit board that is inexpensive to produce and which can be used in mortise locks having different backsets so that the number of printed circuit board variants is minimized.

In accordance with an aspect of the present invention, the printed circuit board includes a first printed circuit board and second printed circuit board connected to a printed circuit board connector and a contact pad. The contact pad, which can be adapted to a backset of the mortise lock, is arranged on the first printed circuit board, and the printed circuit board connector and plug contact are arranged on the second printed circuit board.

In one aspect, the contact pad advantageously has conductive tracks. Because the printed circuit board connector can be inserted into the contact pad by centering domes, the required conductive tracks can be contacted very easily.

In another aspect, cutting edges are formed at the contact pad. Each cutting edge is formed by a notch arranged in the region of the contact pad so that the material thickness of the first printed circuit board is reduced in this region. The notch is preferably formed in a V-shape, since this shape of notch is easy and inexpensive to produce. Other notch shapes are conceivable as well. Further cutting edges are preferably provided in the portion of the contact pad to ensure a backset gradation.

In another aspect, the contact pad has pairs of centering bores. The centering bores serve to receive centering domes, which are arranged at the printed circuit board connector so as to provide a simple receptacle for the printed circuit board connector.

In accordance with another aspect of the invention, centering domes are also advantageously arranged at the printed circuit board connector. The centering domes in this embodiment are already aligned with respect to the printed circuit board connector, wherein the centering domes can be produced so as to be aligned in a simple manner.

The centering bores advantageously cooperate with the centering domes. The alignment and centering of the second printed circuit board with respect to the first printed circuit board is ensured by the cooperation of the centering bores with the centering domes.

In another aspect, adjacent pairs of centering bores are advantageously spaced corresponding to a backset gradation. Accordingly, due to the configuration of the centering domes, the printed circuit board connector can engage in a corresponding pair of centering bores which corresponds to the backset of a relevant mortise lock to be used. A backset corresponds, e.g., to 5 millimeters (5 mm).

It is likewise advantageous that the centering bores arranged in pairs are arranged on a plane of associated cutting edges. By removing a partial area of the contact pad, the respective cutting edge renders the respective centering bores located on this plane unusable for centering the second printed circuit board with the first printed circuit board in order to ensure, through the use of remaining centering bores, that a backset gradation is used.

It is also advantageous that of the cutting edge facilitates removal of a partial portion of the contact pad by hand or with a tool. In this way, an excess partial area of the contact pad can be removed from the first printed circuit board in a simple manner.

In another aspect, when connecting the first printed circuit board to the second printed circuit board, the printed circuit board connector advantageously aligns and centers the second printed circuit board with respect to the first printed circuit board by the centering domes and centering bores. The alignment and centering ensures a reliable contacting between the printed circuit board connector and the conductive tracks of the first printed circuit board so that assembly can be carried out in a simple manner.

In another aspect, the centering domes are configured to be guided into the centering bores of the contact pad, which centering bores are arranged in pairs. This ensures that the first printed circuit board contacts the second printed circuit board by the printed circuit board connector because the centering dome aligns and centers the second printed circuit board with respect to the first printed circuit board.

In another aspect, the printed circuit board connector advantageously contacts the conductive tracks of the contact pad. The conductive tracks are accordingly contacted in a simple manner by the printed circuit board connector.

BRIEF DESCRIPTION OF THE DRAWINGS

In the following, further steps improving the invention are explained in more detail in the description of preferred embodiments of the invention with reference to the drawings. In the drawings.

DETAILED DESCRIPTION OF THE PRESENTLY PREFERRED EMBODIMENTS

Figure 1:
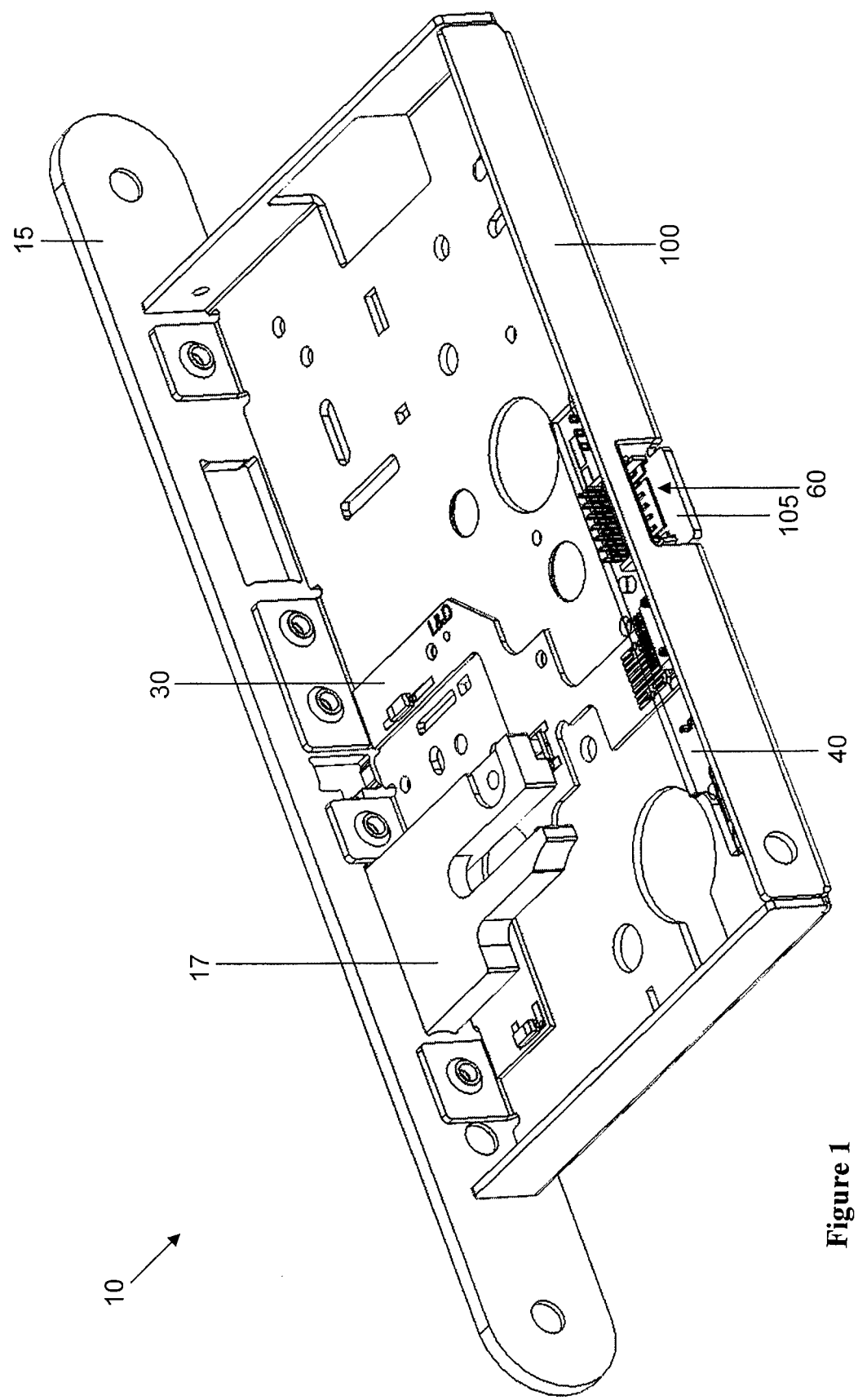
FIG. 1 is a perspective view of a first mortise lock without a housing cover, in which the lock mechanism is omitted for the sake of clarity.

FIG. 1 is a perspective view of a first mortise lock 10 in which a housing cover of a first mortise lock 10 is omitted so as to allow a better view into a first housing 100. For the sake of clarity, the lock mechanism is also omitted in the figure because it is not essential to the description of the invention. A plate 15 having openings is arranged at the first housing 100, one of these openings being used by a bolt 17 for guiding it in or out of the first housing 100 by means of the lock mechanism, not shown. The first housing 100 has an opening 105 through which a plug can be guided from outside of the first housing 100 to a plug contact 60. This plug contact 60 is arranged at a second printed circuit board 40, which is arranged inside the first housing 100. The second printed circuit board 40 is electrically and electronically connected to a first printed circuit board 30, the first printed circuit board 30 also being arranged inside the first housing 100.

Figure 2:
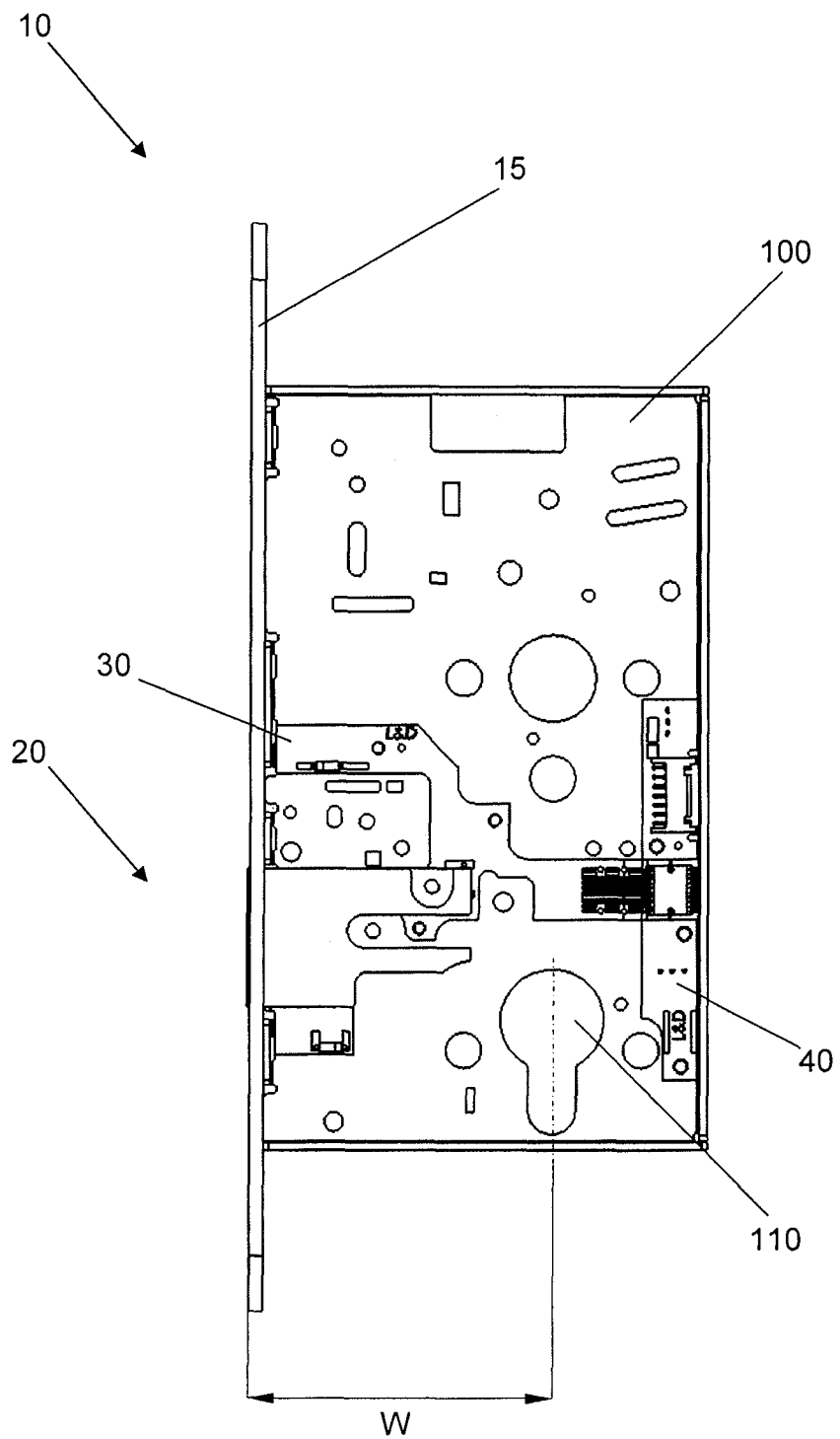
FIG. 2 is a top view of the first mortise lock from FIG. 1.

FIG. 2 is a top view of the first mortise lock 10 from FIG. 1, in which the plate 15 is arranged at the first housing 100. The first printed circuit board 30 and second printed circuit board 40, which are electrically and electronically connected to one another, are arranged in the first housing 100. In FIG. 2, the mortise lock 10 has a backset W extending from the center of a lock cylinder opening 110 for a lock cylinder to an outer edge of the plate 15. The backset can also be specified from the center of a handle receptacle, not shown, for a door handle to the outer edge of the plate 15.

Figure 3:
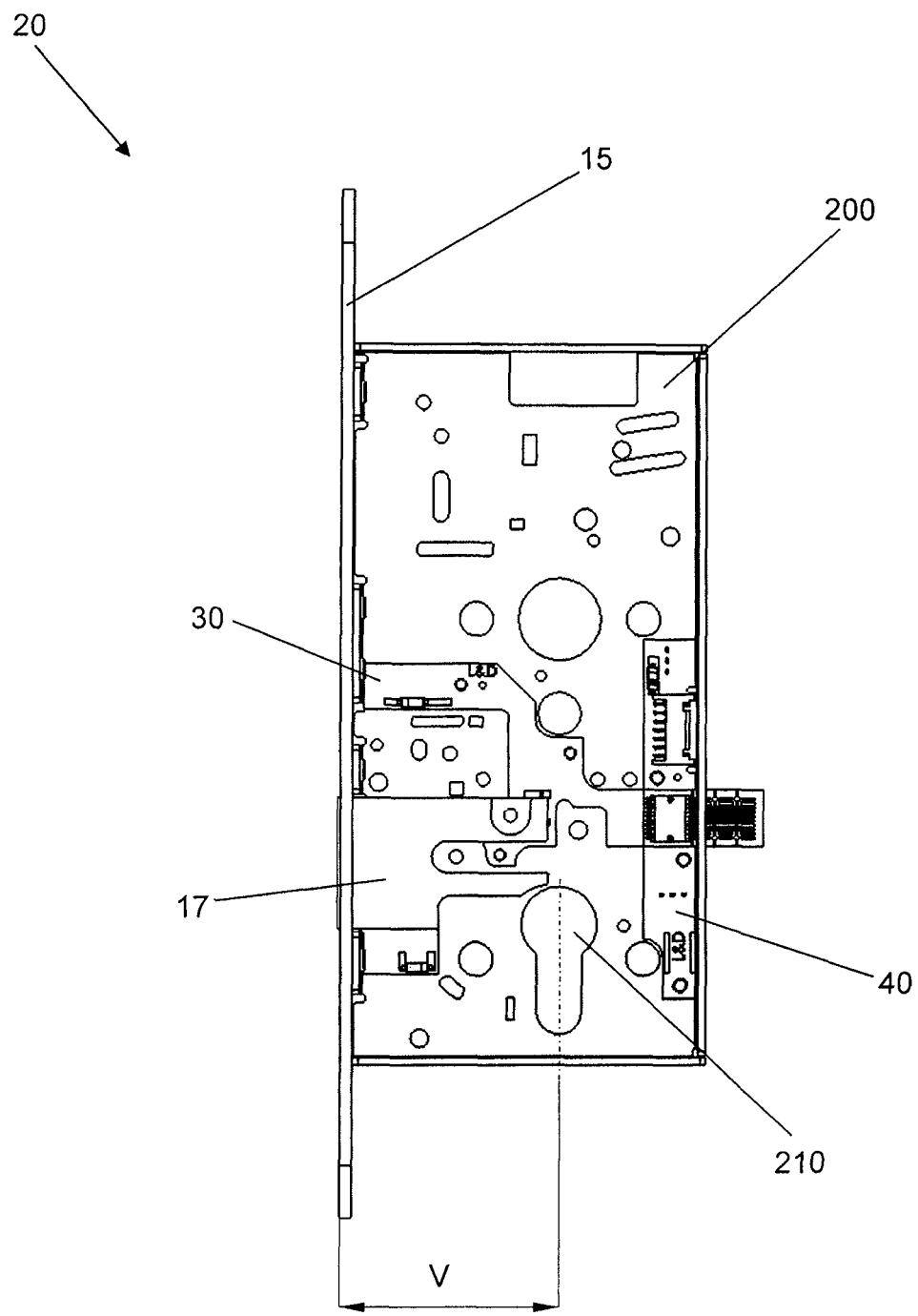
FIG. 3 is a top view of a second mortise lock without a housing cover, in which a portion of a first printed circuit board projects out of the housing, the lock mechanism being omitted for the sake of clarity.

FIG. 3 is a top view of a second mortise lock 20, in which the housing cover has been omitted to allow a view into a second housing 200. For the sake of clarity, the lock mechanism is also omitted because it is not essential to the description of the invention. A plate 15 having openings is arranged at the second housing 200, one of these openings being used by a bolt 17 for guiding it in or out of the second housing 200 by the lock mechanism, not shown. It can be seen from FIG. 3 that a portion of the first printed circuit board 30 projects out of the second housing 200, which is intended to show that the first printed circuit board 30 must be machined in order to prepare it for reliably functioning for this second mortise lock 20. In FIG. 3, the second mortise lock 20 has a backset V extending from the center of the lock cylinder opening 210, for a lock cylinder, to the outer edge of the plate 15, this lock cylinder opening 210 also being provided in the second housing 200. The backset can also be specified from the center of a handle receptacle, not shown, for a door handle to the outer edge of the plate 15.

Figure 4:
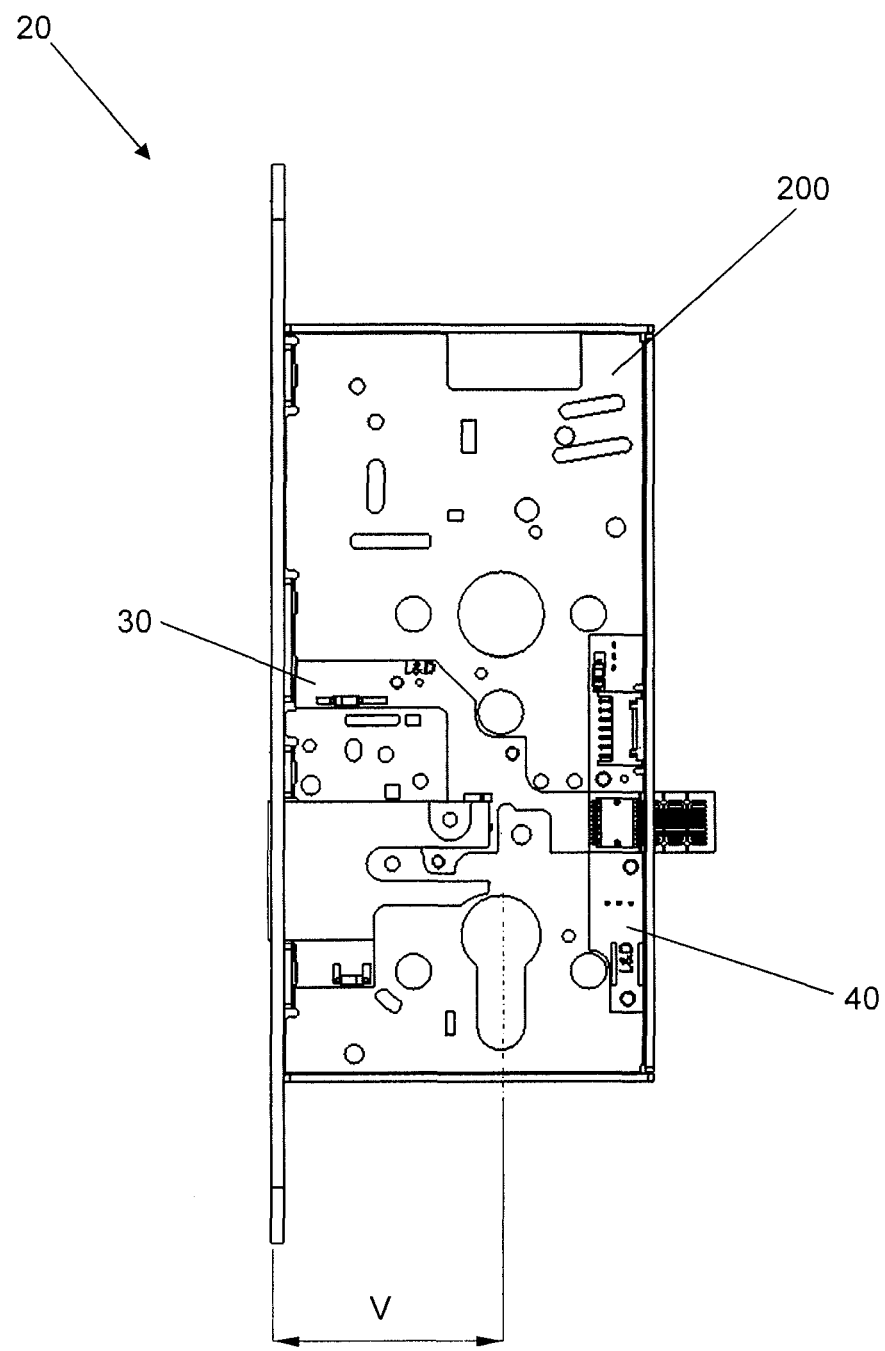
FIG. 4 shows the second mortise lock from FIG. 3, in which the portion of the first printed circuit board projecting out of the housing is omitted.

FIG. 4 shows the second mortise lock 20 with backset V from FIG. 3, in which the first printed circuit board 30 has been machined and arranged in the second housing 200, and the first printed circuit board 30 is electrically and electronically connected to the second printed circuit board 40.

Figure 5:
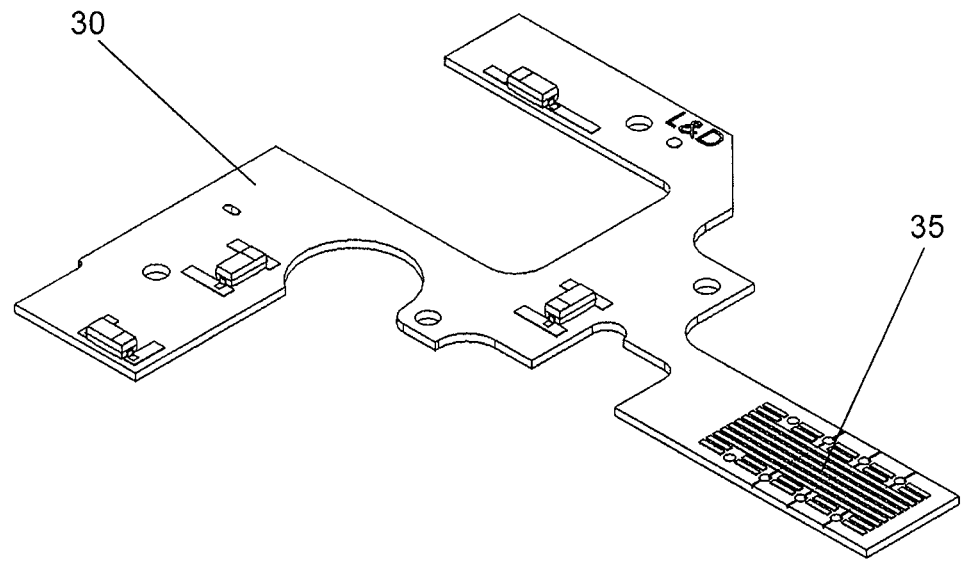
FIG. 5 is a perspective view of the first printed circuit board.

FIG. 5 is a perspective view of the first printed circuit board 30, in which the first printed circuit board 30 has a portion in which a contact pad 35 is arranged. The contact pad 35 has conductive tracks, which can be contacted by a printed circuit board connector 50.

Figure 6:
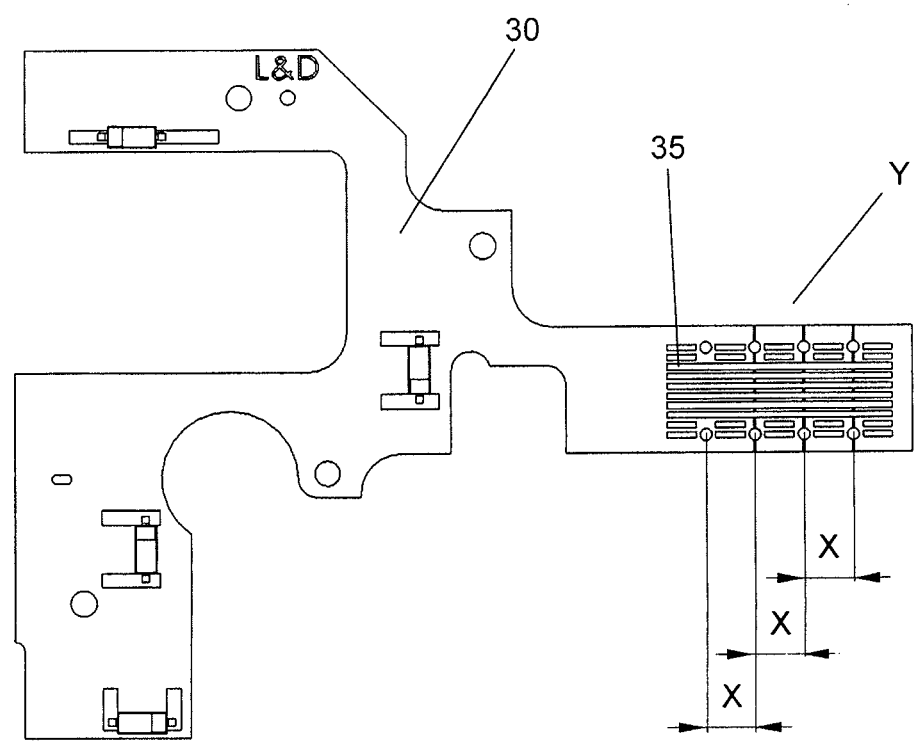
FIG. 6 is a top view of the first printed circuit board from FIG. 5 with additional detail.

FIG. 6 is a top view of the first printed circuit board 30, in which the contact pad 35 has gradations X. The portion of the first printed circuit board 30 in which the contact pad 35 is arranged is shown in a detail Y.

Figure 7:
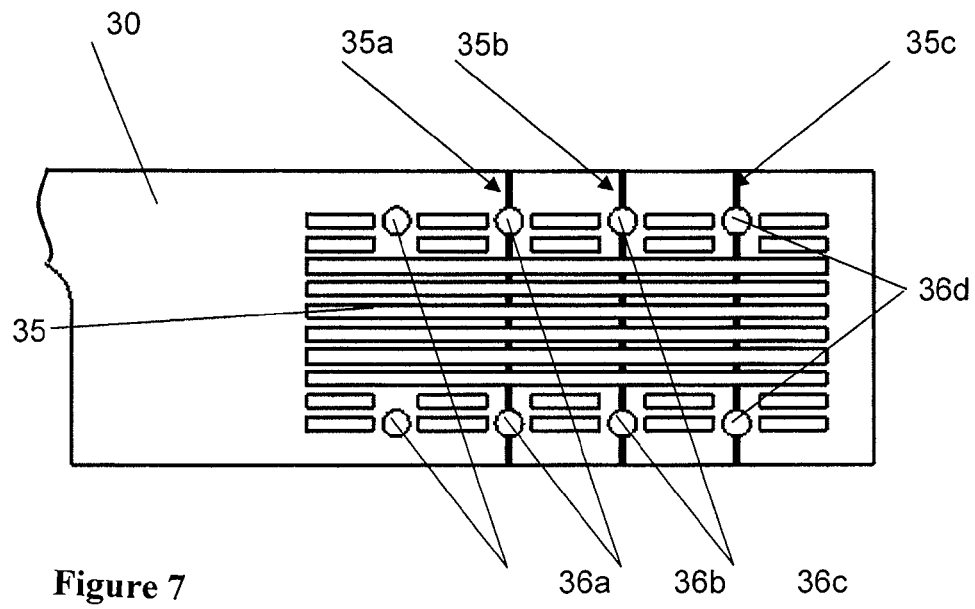
FIG. 7 is an enlarged view of the detail shown in FIG. 6.

FIG. 7 is an enlarged view of detail Y from FIG. 6. The portion of the contact pad 35 of the first printed circuit board 30 contains first centering bores 36a and a first cutting edge 35a, second centering bores 36b being arranged on the plane thereof, and a second cutting edge 35b, third centering bores 36c being arranged on the plane thereof, and a third cutting edge 35c, and fourth centering bores 36d being arranged on the plane thereof.

Figure 8:
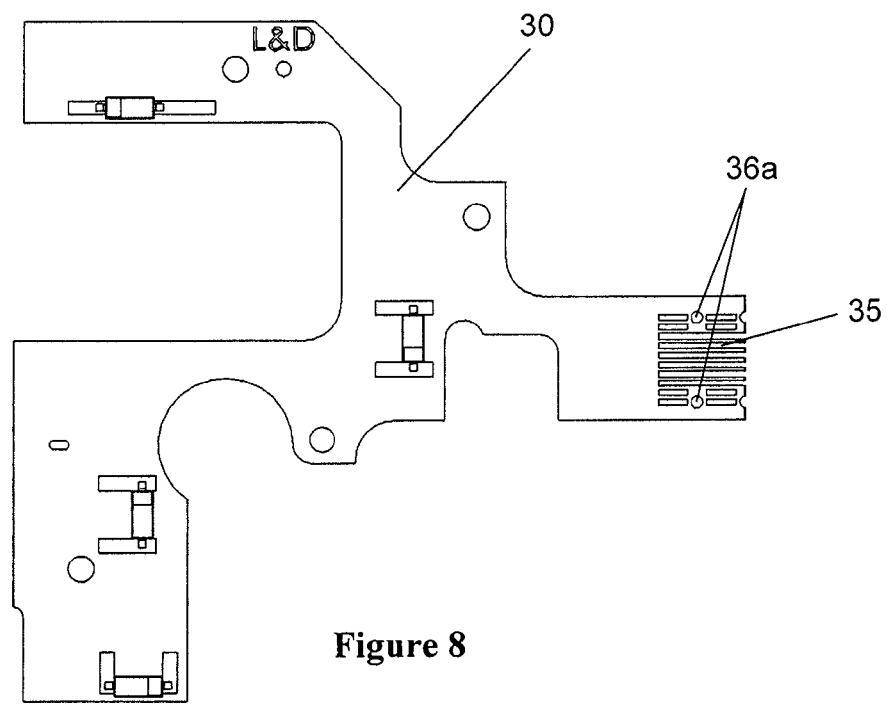
FIG. 8 shows the first printed circuit board from FIG. 6, in which a portion of the printed circuit board corresponding to the portion of the first printed circuit board in FIG. 4 is omitted.

FIG. 8 shows the first printed circuit board 30 machined in such a way that a partial area of the contact pad 35 is removed. The removed portion is the portion following cutting edge 35a so that centering bores 36a continue to be present on the contact pad 35.

Figure 9:
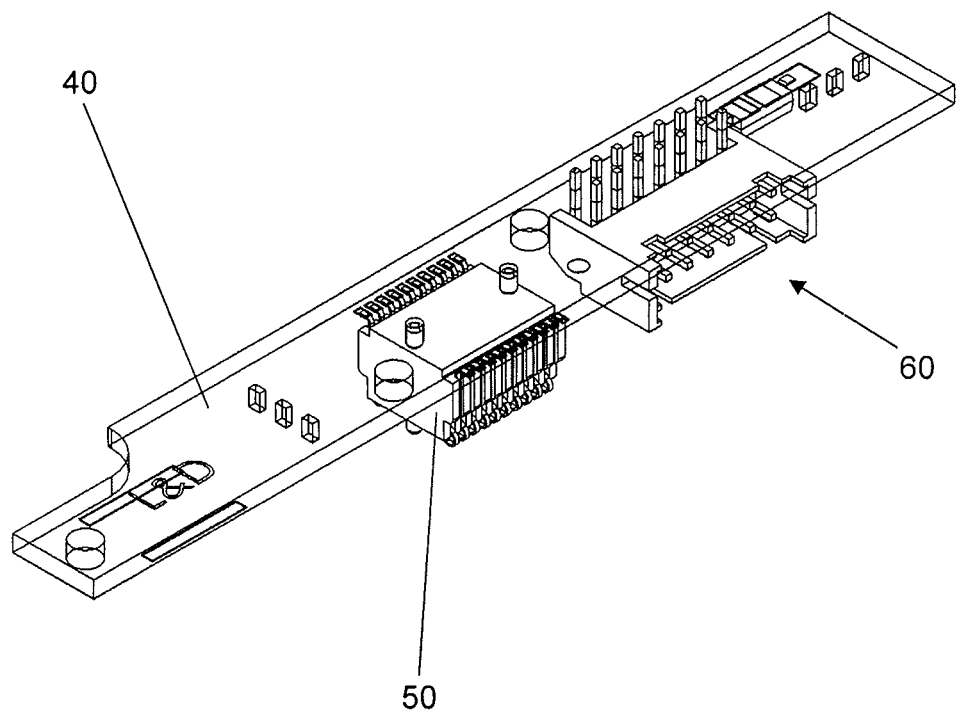
FIG. 9 is a perspective view of a second printed circuit board.

FIG. 9 is a perspective view of the second printed circuit board 40, in which a printed circuit board connector 50 and a plug contact 60 are arranged at the second printed circuit board 40.

Figure 10:
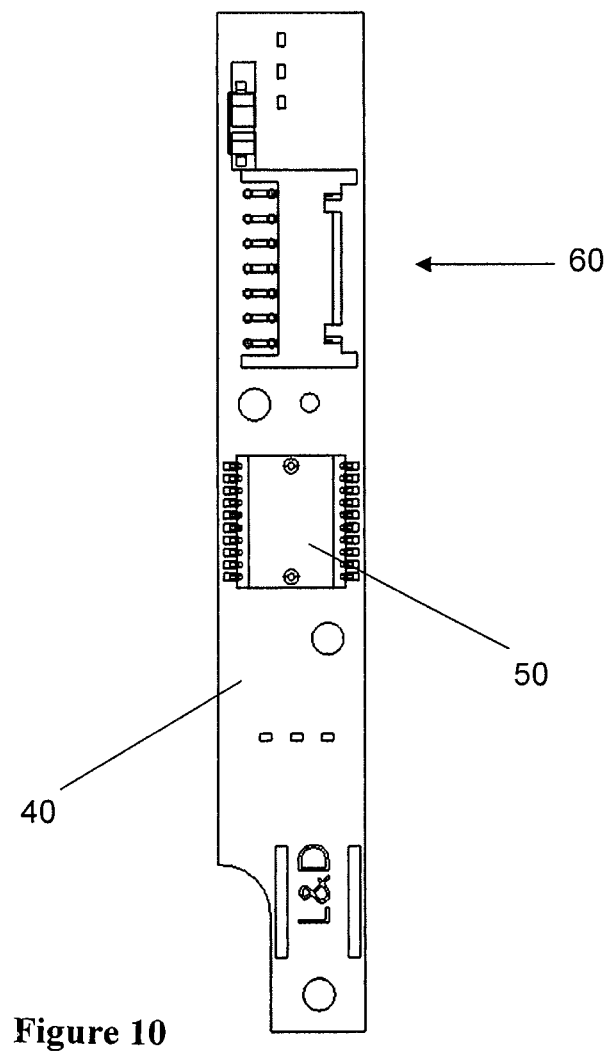
FIG. 10 is a top view of the second printed circuit board from FIG. 9.

FIG. 10 is a top view of the second printed circuit board 40 from FIG. 9, in which the printed circuit board connector 50 and the plug contact 60 are shown.

Figure 11:
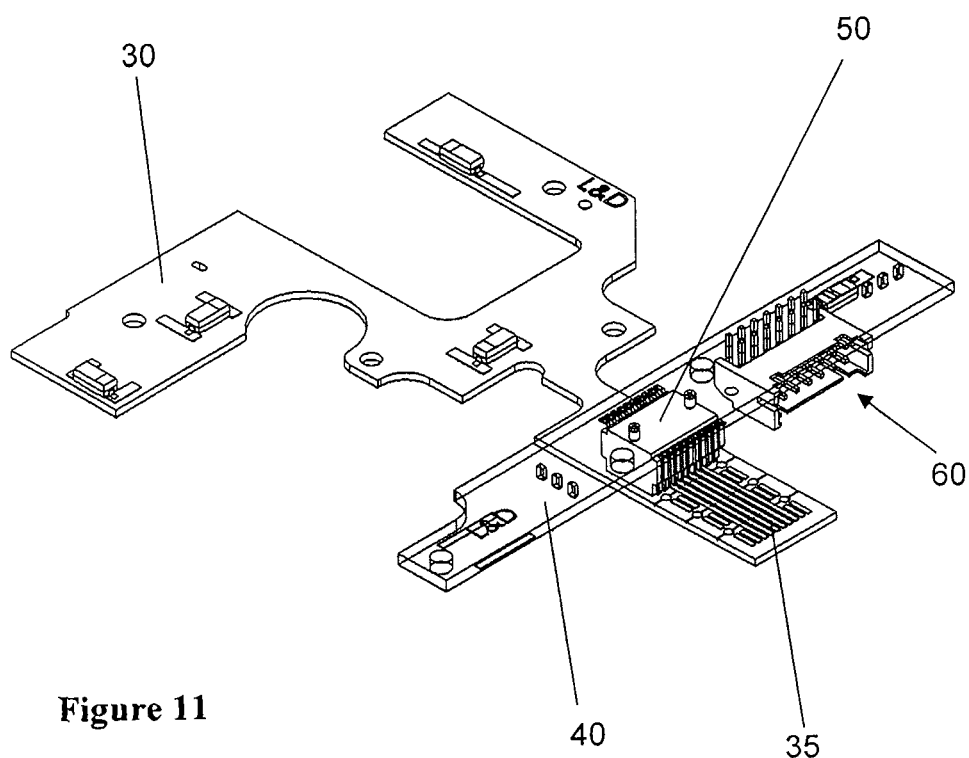
FIG. 11 is a perspective view of the first printed circuit board and the second printed circuit board, which are connected to one another.

FIG. 11 is a perspective view of the printed circuit board, in which the first printed circuit board 30 and the second printed circuit board 40 are connected to one another in their functional position by a printed circuit board connector 50. In providing this connection, the printed circuit board connector 50 contacts the contact pad 35.

Figure 12:
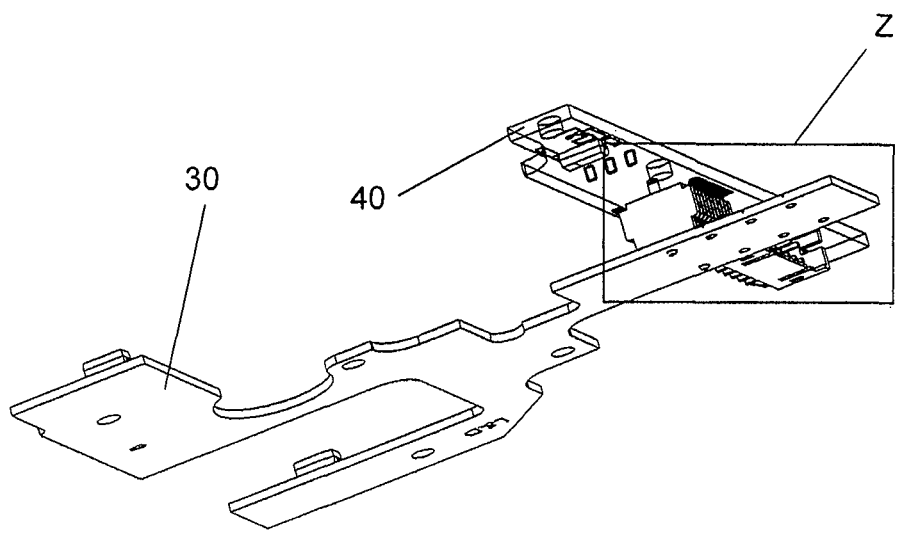
FIG. 12 is another perspective view of the first printed circuit board and the second printed circuit board connected to one another, shown with additional detail.

FIG. 12 is another perspective view of the printed circuit board from FIG. 11, in which a detail Z shows a partial area of the first printed circuit board 30 connected with the second printed circuit board 40.

Figure 13:
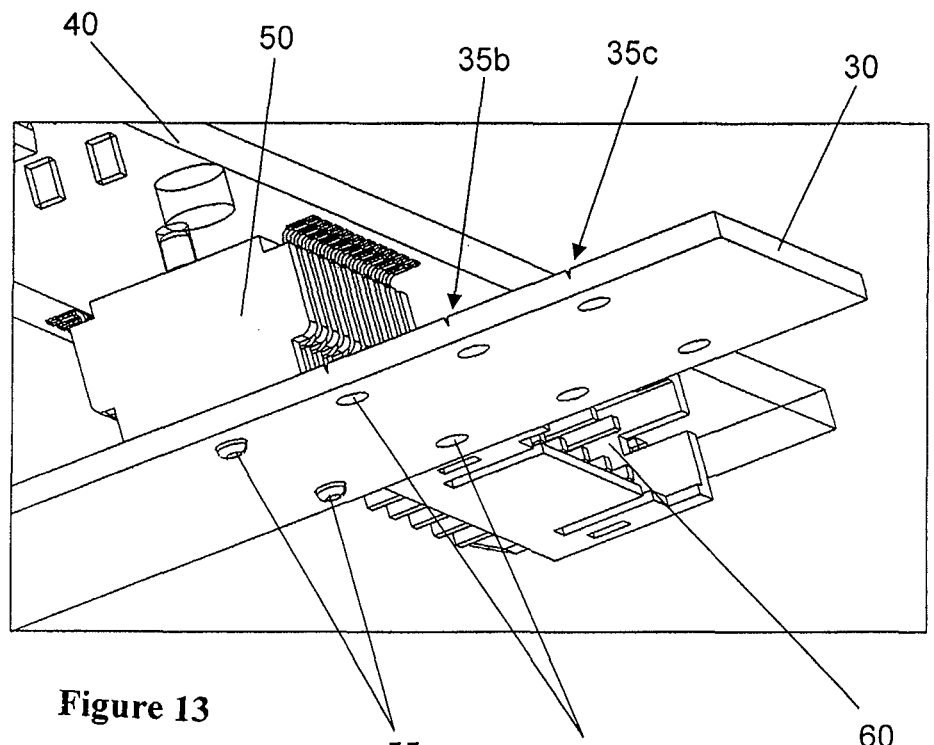
FIG. 13 is an enlarged view of the detail from FIG. 12.

FIG. 13 is an enlarged view of the detail Z from FIG. 12. The first printed circuit board 30 has cutting edges 35b and 35c, which are clearly shown in FIG. 13. The first printed circuit board 30 is connected to the second printed circuit board 40 by the printed circuit board connector 50. Centering domes 55 of the printed circuit board connector 50 engage in the first centering bores 36a so that the second printed circuit board 40 is aligned and centered with respect to the first printed circuit board 30. Contact is made between the first printed circuit board 30 and the second printed circuit board 40 by the printed circuit board connector 50, this printed circuit board connector 50 making contact with the contact pad 35. The centering bores of the first printed circuit board 30 can be seen. In FIG. 13, only centering bores 36b are shown. In this detailed view, the plug contact 60 can also be seen.

The disclosed embodiments are directed to a printed circuit board used in mortise locks. The mortise locks, e.g., mortise locks 100, 200, can have different backsets. The printed circuit board is formed of a first printed circuit board 30 and a second printed circuit board 40 which are electrically and electronically connected to one another by a printed circuit board connector 50. The first printed circuit board 30 has a contact pad 35 at which pairs of centering bores 36a, 36b, 36c, 36d and cutting edges 35a, 35b, 35c are arranged. A pair of centering bores 36a, 36b, 36c, 36d has a spacing with respect to the adjacent pair of centering bores 36a, 36b, 36c, 36d, which spacing corresponds to a backset gradation X of 5 mm, for example. The contact pad 35 is configured such that pairs of centering bores 36b, 36c, 36d are arranged on a plane of the cutting edges 35a, 35b, 35c, and the contact pad 35 has conductive tracks that correspond to conductive tracks of the printed circuit board connector 50.

When using a first mortise lock 10 with a first housing 100, there is a backset of the first housing W, which allows the printed circuit board to be mounted in the first housing 100 without having to remove a partial area of the contact pad.

When using a second mortise lock 20 with a second housing 200, there is a backset of the second housing V. The backset of the second housing V is smaller than the backset of the first housing W. In order to mount the printed circuit board in the second housing 200, it is necessary to remove a partial area of the contact pad 35. This is done by hand or by a tool.

When removing a partial area of the contact pad 35, one of the cutting edges 35a, 35b, 35c is used, these cutting edges 35a, 35b, 35c serving to support the removal of the partial area. The mortise lock and, accordingly, the backset used by the mortise lock, determine which of the cutting edges 35a, 35b, 35c will be used for the removal of a partial area of the contact pad 35.

For example, when using the second mortise lock 20, which has a backset of the second housing V, the first cutting edge 35a is to be used to remove an excess partial area of the contact pad 35, as is shown in FIG. 8. In this way, the printed circuit board can be mounted in the second housing 200 of the mortise lock 20. In so doing, the centering domes 55 are guided into the first centering bores 36a.

If the second cutting edge 35b is used for removing an excess partial area of the contact pad 35, the centering domes 55 are guided into the second centering bores 36b. In this case, the centering domes 55 can be guided into the first centering bores 36a. If the third cutting edge 35c is used to remove an excess partial area of the contact pad 35, the centering domes 55 are guided into the third centering bores 36c. In this case, the centering domes 55 can be guided into the first centering bores 36a or into the second centering bores 36b.

The contact pad 35 of the first printed circuit board 30 configured such that centering bores 36b are arranged on the plane of cutting edge 35a, centering bores 36c are arranged on the plane of cutting edge 35b, and centering bores 36d are arranged on the plane of cutting edge 35c.

The first cutting edge 35a has a spacing with respect to the second cutting edge 35b, which spacing corresponds to a backset gradation X. Cutting edge 35b also has a spacing with respect to cutting edge 35c, which spacing corresponds to a backset gradation X.

Since the second centering bores 36b are arranged on the plane of the first cutting edge 35a, and the third centering bores 36c are arranged on the plane of the second cutting edge 35b, and the fourth centering bores 36d are arranged on the plane of the third cutting edge 35c, the second centering bores 36b have a spacing with respect to the third centering bores 36c that corresponds to a backset gradation X. The third centering bores 36c also have a spacing from the fourth centering bores 36d that corresponds to a backset gradation X. The first centering bores 36a are arranged at the contact pad 35 of the first printed circuit board 30 such that they likewise have a spacing from the second centering bores 36b that corresponds to a backset gradation X.

If a partial area of the contact pad 35 of the first printed circuit board 30 has been removed, or if removal of a partial area is not required, the first printed circuit board 30 is electrically and electronically connected to the second printed circuit board 40 by the printed circuit board connector 50, the centering domes 55 are guided into a pair of centering bores 36a, 36b, 36c, 36d and the printed circuit board connector 50 contacts the contact pad 35. The printed circuit board connector 50 is arranged on the second printed circuit board 40 in the factory. The printed circuit board connector 50 has a plug contact 60 so that the printed circuit boards can be connected to a power source by a plug. This plug is guided from outside the housing 100, 200 through an opening 105 of the housing 100, 200 into the interior of the housing 100, 200 to reach the plug contact 60 of the printed circuit board.

Thus, depending on the respective backset, a printed circuit board can be used in which a partial area can be removed if necessary in order to install the printed circuit board in a reliably functioning manner in a housing 100, 200.

The preceding description of the present invention serves only to illustrate and not to limit the invention. Various alterations and modifications are possible within the framework of the invention without departing from the scope of the invention or equivalents thereof.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

The invention claimed is:

1. A mortise lock comprising:
   a first printed circuit board (30);
   a contact pad (35) arranged on the first printed circuit board (30), the contact pad (35) having pairs of centering bores (36a, 36b, 36c, 36d);
   a second printed circuit board (40);
   a printed circuit board connector (50) arranged on the second printed circuit board (40), the printed circuit board connector (50) being configured to connect the first printed circuit board (30) to the second printed circuit board (40), the printed circuit board connector (50) having centering domes (55); and
   a plug contact (60) arranged on the second printed circuit board (40), the plug contact (60) being configured to be accessible from outside of the mortise lock,
   wherein the centering bores (36a, 36b, 36c, 36d) of the contact pad (35) cooperate with the centering domes (55) of the printed circuit board connector (50) in connecting the first printed circuit board (30) to the second printed board (40).

2. The mortise lock according to claim 1, wherein the contact pad (35) has conductive tracks.

3. The mortise lock according to claim 2, wherein the printed circuit board connector (50) contacts the conductive tracks of the contact pad (35).

4. The mortise lock according to claim 1, wherein the contact pad (35) is configured so as to be adapted to a backset of the mortise lock.

5. The mortis lock according to claim 1, further comprising a housing (100) defining an opening (105) through which the plug contact (60) is accessible from outside of the mortise lock.

6. The mortis lock according to claim 1, wherein the first and second printed circuit boards (30, 40) include circuitry adapted to use status requests and/or motor-actuated control of individual components of the mortise lock.

7. A mortise lock comprising:
- a first printed circuit board (30);
- a contact pad (35) arranged on the first printed circuit board (30);
- a second printed circuit board (40);
- a printed circuit board connector (50) arranged on the second printed circuit board (40), the printed circuit board connector (50) being configured to connect the first printed circuit board (30) to the second printed circuit board (40); and
- a plug contact (60) arranged on the second printed circuit board (40), the plug contact (60) being configured to be accessible from outside of the mortise lock,
- wherein the first printed circuit board has cutting edges (35a, 35b, 35c) formed at the contact pad (35).

8. The mortise lock according to claim 7, wherein the contact pad (35) has pairs of centering bores (36a, 36b, 36c, 36d).

9. The mortise lock according to claim 8, wherein the printed circuit board connector (50), has centering domes (55).

10. The mortise lock according to claim 9, wherein the centering bores (36a, 36b, 36c, 36d) cooperate with the centering domes (55) in connecting the first printed circuit board (30) to the second printed board (40).

11. The mortise lock according to claim 10, wherein the printed circuit board connector (50) is configured to align and center the second printed circuit board (40) with respect to the first printed circuit board (30), when connecting the first printed circuit board (30) to the second printed circuit board (40), using the centering domes (55) and centering bores (36a, 36b, 36c, 36d).

12. The mortise lock according to claim 9, wherein the centering domes (55) are configured so as to be guidable into the centering bores (36a, 36b, 36c, 36d) of the contact pad (35).

13. The mortise lock according to claim 8, wherein adjacent pairs of centering bores (36a, 36b, 36c, 36d) have a spacing, respectively, which corresponds to a backset gradation (X) associated with a spacing of associated ones of the cutting edges (35a, 35b, 35c).

14. The mortise lock according to claim 8, wherein the centering bores (36b, 36c, 36d) are arranged on a plane of the cutting edges (35a, 35b, 35c).

15. The mortise lock according to claim 14, wherein the cutting edges (35a, 35b, 35c) are configured to facilitate removal of a partial portion of the contact pad (35) by hand or with a tool.

* * * * *